United States Patent
McBride

(10) Patent No.: US 6,311,314 B1
(45) Date of Patent: Oct. 30, 2001

(54) SYSTEM AND METHOD FOR EVALUATING THE LOADING OF A CLOCK DRIVER

(75) Inventor: John G McBride, Ft Collins, CO (US)

(73) Assignee: Hewlett-Packard Company, Palo Alto, CA (US)

(*) Notice: Subject to any disclaimer, the term of this patent is extended or adjusted under 35 U.S.C. 154(b) by 0 days.

(21) Appl. No.: 09/300,205

(22) Filed: Apr. 27, 1999

(51) Int. Cl.$^7$ ..................................................... G06F 17/50
(52) U.S. Cl. ................................................................ 716/6
(58) Field of Search ............................................ 716/1–21

(56) References Cited

U.S. PATENT DOCUMENTS

| | | | | |
|---|---|---|---|---|
| 5,210,701 | * | 5/1993 | Hana et al. ................................ | 716/1 |
| 5,638,291 | * | 6/1997 | Li et al. .................................... | 716/18 |
| 5,963,728 | * | 10/1999 | Hathaway et al. ........................ | 716/3 |
| 6,006,025 | * | 12/1999 | Cook et al. ............................... | 716/14 |
| 6,053,950 | * | 4/2000 | Shinagawa ................................ | 716/2 |
| 6,266,803 | * | 7/2001 | Scherer et al. ........................... | 716/12 |

FOREIGN PATENT DOCUMENTS

| | | | | |
|---|---|---|---|---|
| 409258840-A | * | 10/1997 | (JP) .................................... | G06F/1/10 |

OTHER PUBLICATIONS

Mehta et al. ("Clustering and load balancing for buffered clock tree synthesis", Proceedings of 1997 IEEE International Conference on Computer Design: VLSI in Computers and Processors, Oct. 12, 1997, pp. 217–223).*

* cited by examiner

Primary Examiner—Matthew Smith
Assistant Examiner—Phallaka Kik

(57) ABSTRACT

The present invention is generally directed to a system and method for evaluating the loading of a clock driver. Specifically, the present invention operates by evaluating a netlist file of a circuit. In accordance with one aspect of the present invention, a method evaluates each node within a netlist file to determine: (1) whether that node is an output node for a clock driver; and (2) for clock driver nodes, whether that node is within loading specification for the particular clock driver circuit. In accordance with one embodiment of the invention, the method operates by identifying a clock driver output node, calculating a PFET: NFET ratio of the clock driver output node, determining a "category" of the clock driver output node, obtaining a load on the clock driver output node, and determining whether the load is within specification for the clock driver circuit. In accordance with the preferred embodiment, the step of identifying a clock driver output node is performed by evaluating a data structure associated with that node. Specifically, in the preferred embodiment a database is created, whereby each node and each element within a netlist file has certain characteristics or attributes that are determined during a preliminary stage of operation, and stored within a data structure for subsequent retrieval and use. One such flag or attribute that is stored for each node is a clock attribute. Any node associated with a clock driver circuit may be readily determined by evaluating this attribute stored within the data structure. This information may be obtained from PathMill or some other similar software package.

16 Claims, 10 Drawing Sheets

```
NODE{ ~~~

~~~
        CAPACITANCE
        CLOCK
        ~~~

~~~}
```

SYSTEM AND METHOD FOR EVALUATING THE LOADING OF A CLOCK DRIVER

BACKGROUND OF THE INVENTION

1. Field of the Invention

The present invention generally relates to computer-aided circuit design systems, and more particularly to a system and method for evaluating the loading of a clock driver to determine whether the loading of a clock driver is within specifications.

2. Discussion of the Related Art

Integrated circuits are electrical circuits comprised of transistors, resistors, capacitors, and other components on a single semiconductor "chip" in which the components are interconnected to perform a given function such as a microprocessor, programmable logic device (PLD), electrically erasable programmable memory (EEPROM), random access memory (RAM), operational amplifier, or voltage regulator. A circuit designer typically designs the integrated circuit by creating a circuit schematic indicating the electrical components and their interconnections. Often, designs are simulated by computer to verify functionality and ensure performance goals are satisfied.

In the world of electrical device engineering, the design and analysis work involved in producing electronic devices is often performed using electronic computer aided design (E-CAD) tools. As will be appreciated, electronic devices include electrical analog, digital, mixed hardware, optical, electromechanical, and a variety of other electrical devices. The design and the subsequent simulation of any circuit board, VLSI chip, or other electrical device via E-CAD tools allows a product to be thoroughly tested and often eliminates the need for building a prototype. Thus, today's sophisticated E-CAD tools may enable the circuit manufacturer to go directly to the manufacturing stage without costly, time consuming prototyping.

In order to perform the simulation and analysis of a hardware device, E-CAD tools must deal with an electronic representation of the hardware device. A "netlist" is one common representation of a hardware device. As will be appreciated by those skilled in the art of hardware device design, a "netlist" is a detailed circuit specification used by logic synthesizers, circuit simulators and other circuit design optimization tools. A netlist typically comprises a list of circuit components and the interconnections between those components.

The two forms of a netlist are the flat netlist and the hierarchical netlist. Often a netlist will contain a number of circuit "modules" which are used repetitively throughout the larger circuit. A flat netlist will contain multiple copies of the circuit modules essentially containing no boundary differentiation between the circuit modules and other components in the device. By way of analogy, one graphical representation of a flat netlist is simply the complete schematic of the circuit device.

In contrast, a hierarchical netlist will only maintain one copy of a circuit module which may be used in multiple locations. By way of analogy, one graphical representation of a hierarchical netlist would show the basic and/or non-repetitive devices in schematic form and the more complex and/or repetitive circuit modules would be represented by "black boxes." As will be appreciated by those skilled in the art, a black box is a system or component whose inputs, outputs, and general function are known, but whose contents are not shown. These "black box" representations, hereinafter called "modules", will mask the complexities therein, typically showing only input/output ports.

An integrated circuit design can be represented at different levels of abstraction, such as the Register-Transfer level (RTL) and the logic level, using a hardware description language (HDL). VHDL and Verilog are examples of HDL languages. At any abstraction level, an integrated circuit design is specified using behavioral or structural descriptions or a mix of both. At the logical level, the behavioral description is specified using boolean equations. The structural description is represented as a netlist of primitive cells. Examples of primitive cells are full-adders, NAND gates, latches, and D-Flip Flops.

Having set forth some very basic information regarding the representation of integrated circuits and other circuit schematics through netlists, systems are presently known that use the information provided in netlists to evaluate circuit timing and other related parameters. More specifically, systems are known that perform a timing analysis of circuits using netlist files. Although the operational specifics may vary from system to system, generally such systems operate by identifying certain critical timing paths, then evaluating the circuit to determine whether timing violations may occur through the critical paths. As is known, timing specifications may be provided to such systems by way of a configuration file.

One such system known in the prior art is marketed under the name PathMill, by EPIC Design Technology, Inc. (purchased by Synopsys). PathMill is a transistor-based analysis tool used to find critical paths and verify timing in semiconductor designs. Using static and mixed-level timing analysis, PathMill processes transistors, gates, and timing models. It also calculates timing delays, performs path searches, and checks timing requirements. As is known, PathMill can analyze combinational designs containing gates, and sequential designs containing gates, latches, flip-flops, and clocks. Combinational designs are generally measured through the longest and shortest paths.

While tools such as these are useful for the design verification process after layout, there are various circuit characteristics, attributes, or configurations that are not identified and/or addressed in the PathMill product and other similar products. For example, there is often a need to evaluate a circuit to ensure that signal loading is not violated. More specifically, there is often a need to evaluate certain driver circuit configurations to ensure that the driver circuits are configured to adequately drive the surrounding circuit components.

By way of particular example, it is generally undesirable for a clock driver to drive either an excessive number of gates or too few gates. Of course, the number of gates that may be driven by a given clock driver will necessarily vary depending upon the size/strength of the driver, as well as the capacitance at the output of the clock driver.

Accordingly, it is generally desirable to provide a system that is capable of evaluating a netlist to identify clock drivers that not designed to sufficiently drive the surrounding circuitry, in order to obtain a higher quality circuit design.

SUMMARY OF THE INVENTION

Certain objects, advantages and novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

The present invention is generally directed to a system and method for evaluating the loading of a clock driver. Specifically, the present invention operates by evaluating a netlist file of a circuit. In accordance with one aspect of the present invention, a method evaluates each node within a netlist file to determine: (1) whether that node is an output node for a clock driver; and (2) for clock driver nodes, whether that node is within loading specification for the particular clock driver circuit.

In accordance with one embodiment of the invention, the method operates by identifying a clock driver output node, calculating a PFET: NFET ratio of the clock driver output node, determining a "category" of the clock driver output node, obtaining a load on the clock driver output node, and determining whether the load is within specification for the clock driver circuit. In accordance with the preferred embodiment, the step of identifying a clock driver output node is performed by evaluating a data structure associated with that node. Specifically, in the preferred embodiment a database is created, whereby each node and each element within a netlist file has certain characteristics or attributes that are determined during a preliminary stage of operation, and stored within a data structure for subsequent retrieval and use. One such flag or attribute that is stored for each node is a clock attribute. Any node associated with a clock driver circuit may be readily determined by evaluating this attribute stored within the data structure. This information may be obtained from PathMill or some other similar software package. Accordingly, the manner for initially determining this information need not be described herein.

What the present invention does, however, is evaluate a given node (assuming the node is a clock node) to determine whether the node is an output node for the clock driver. An output of a clock driver circuit may be part of an inverter loop. Therefore, an appropriate check may be made to determine whether the clock node (as identified by a flag in a data structure) is a clock output node.

The invention then calculates a PFET: NFET ratio at the clock driver output node. This step involves summing the widths of all PFETs that drive the output node. As a part of this step, effective widths may be calculated as an interim step. An effective width is calculated when multiple PFETs are series connected between the clock driver output node and VDD. A similar calculation is made for NFETs that drive the output node. Then, the total width of the PFETs is divided by the total width of the NFETs driving the node to calculate a ratio at the clock driver output node. This ratio is then used to access a look up table that categorizes the clock driver circuit output node. For example, a first category of a clock driver output node may be identified by a PFET: NFET ratio of approximately 3.33–3.67:1. A second category of a clock driver circuit may be defined by a PFET: NFET ratio of approximately 1.67–2:1. A third category of clock driver circuits may be defined by a PFET: NFET ratio of approximately 2.67–3:1. Consistent with the broader concepts of the invention, additional, or different, categories of clock driver circuits may be defined as well. Similarly, there may be additional ways of categorizing the clock driver circuits.

The invention then obtains a load for the clock driver output node. This load may be specified in the form of a capacitance value associated with the node, which value may be provided by PathMill or other equivalent software package. Alternatively, this value may be separately calculated by a system performing the method of the present invention. Nonetheless, the calculation may be performed in a manner which is known within the prior art, and need not be discussed herein. Finally, the method determines whether the load is within specification for the particular clock driver circuit. Preferably, this step is performed by obtaining a load rating for the determined category of the clock driver. This load rating may be provided in a separate parameter file, which may be accessed utilizing the category determined as part of the present invention. Thereafter, this obtained load rating may be compared against the load for the given clock driver output node to determine whether the actual load is within an acceptable specification range as determined by the category of the clock driver node.

It should be appreciated that a warning message may be generated for any node that may be identified by the present invention as being outside the specification. In this regard, the step of generating an error message should be given an extremely broad interpretation, as the error message could comprise a wide variety of things. For example, it may entail generating a real time message that is displayed to a user. It may involve writing an error message into an filed that may contain a listing of all errors or potential errors in a given circuit design being evaluated by the electrical rules checker. It may also entail simply setting a flag in some location (associated with the element), so that the element can later be readily identified as a potential error, simply by, for example, reading the pre-set flag.

In accordance with another aspect of the invention, and since the preferred embodiment of the present invention is implemented in software, a computer readable storage medium may be provided containing program code for evaluating the output node of a clock driver circuit. In accordance with this aspect of the invention, the computer readable storage medium may contain a plurality of code segments that collectively define the operation of the invention, in accordance with the method described above. Specifically, a first code segment may be provided and configured to identify a clock driver output node. A second code segment may be provided and configured to calculate a PFET: NFET ratio of the clock driver output node. A third code segment may be provided and configured to determine a category of a clock driver output node. A fourth code segment may be provided and configured to obtain a load for the clock driver output node. Finally, a fifth code segment may be provided and configured to determine whether the load is within specification for the particular clock driver circuit. The operation of the various segments is preferably consistent with that of the method steps described above.

DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE PREFERRED EMBODIMENT

Figure 1:
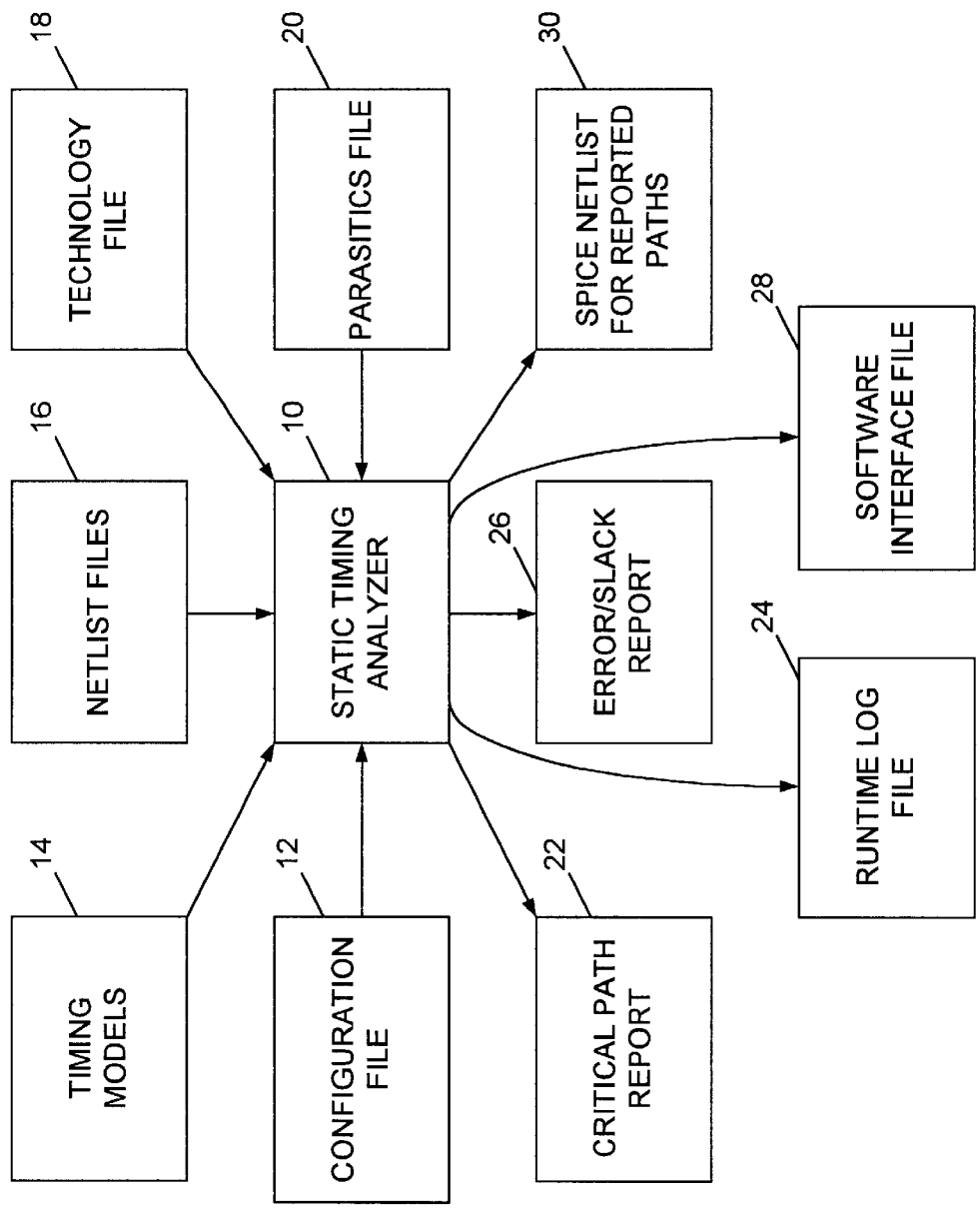
FIG. 1 is a block diagram of a static timing analyzer system, as is known in the prior art.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Referring now to the drawings, reference is made to FIG. 1, which is a block diagram of a prior art static timing analyzer program that illustrates the basic informational flow in such a system. Specifically, and as previously mentioned, one such system is marketed under the name PathMill. FIG. 1 is a diagram that illustrates the informational flow in the PathMill system. At the center of the diagram is a block denoted as static timing analyzer 10, which represents the PathMill program. Surrounding this block 10 are a number of other blocks that represent various input and output files and/or information.

More particularly, the PathMill program may utilize a configuration file 12, a file of timing models 14, one or more netlist files 16, a technology file 18, and a parasitic file 20, for various input information. In addition, the PathMill program may generate a number of different output files or other output information, including a critical path report 22, a runtime log file 24, an error report 26, a software interface file 28, and a SPICE netlist 30. When started, the PathMill program first processes the input netlist file(s) 16, the technology file 18, and the configuration file(s) 12. The information from these files is subsequently used for performing path analyses. Since the PathMill program is publicly available and marketed, its function and operation are well known, and therefore need not be discussed in detail herein.

For purposes of illustrating the present invention, much of the diagram and information illustrated in FIG. 1 is not shown in connection with the inventive system. In this regard, reference is made to FIG. 2, which shows one embodiment of a system constructed in accordance with the present invention. In the illustrated embodiment, only the static timing analyzer 10, the configuration file 12 and the netlist file 16 of FIG. 1 are shown. The configuration file(s) 12 contains information that informs the static timing analyzer 10 how to perform its analysis, and various numbers of configuration files may be used. The netlist file 16, as is known, defines the various integrated circuit components, and their interrelations.

Figure 2:
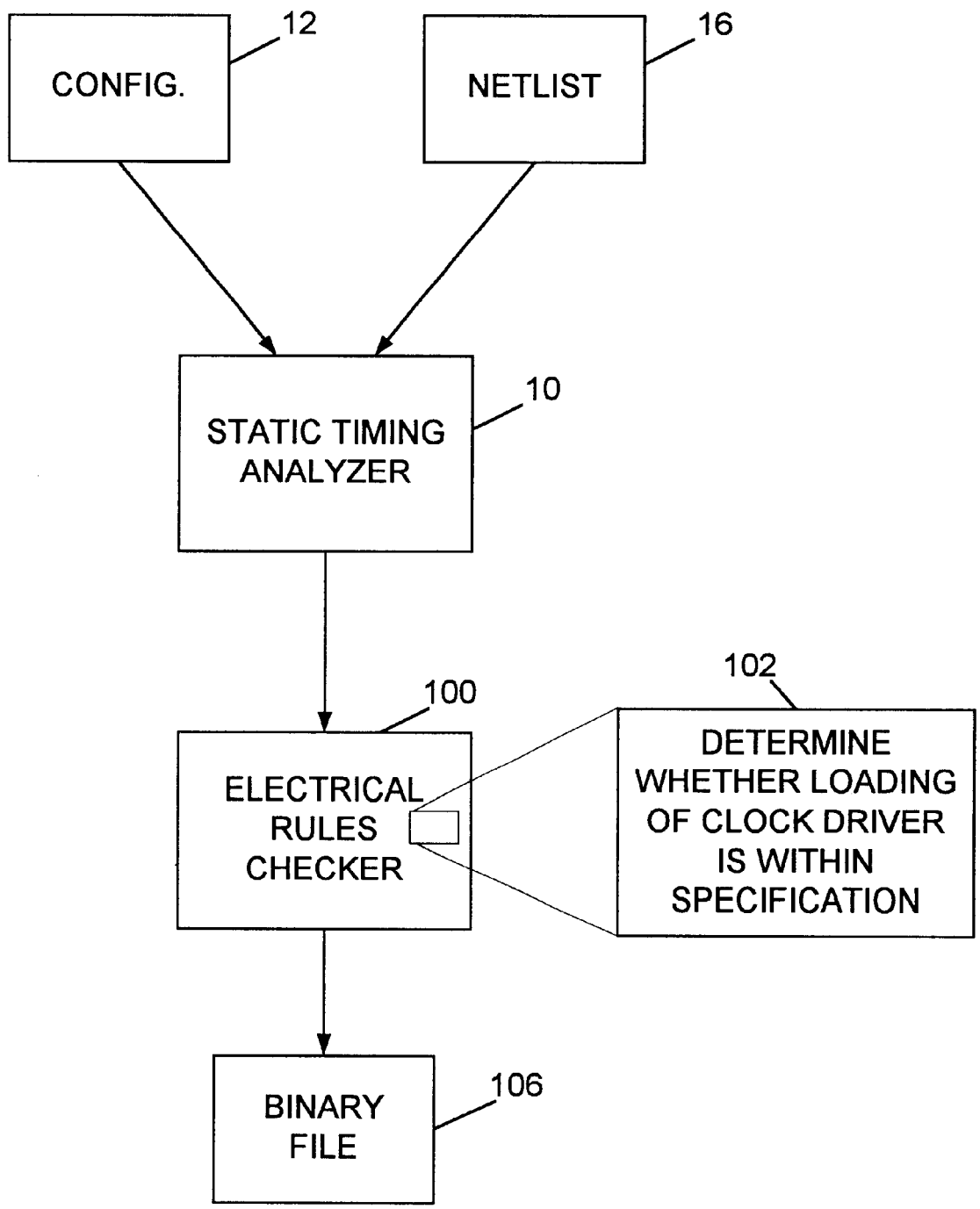
FIG. 2 is a block diagram illustrating the orientation of the electrical rules checking method of the present invention, in relation to an existing static timing analyzer.

The system shown in FIG. 2 preferably utilizes a computer (not shown) for its operation which runs the static timing analyzer program 10 and the electrical rules checker program 100. The computer may be electrically coupled to a memory device (not shown) which functions as a system storage unit for storing the code and data utilized and/or generated by the system. Those skilled in the art will realize that the present invention is not limited to any particular type of computer or memory device for performing these functions.

It should also be noted that the term "computer", as that term is used herein, is intended to denote any machine capable of performing the calculations, or computations, necessary to perform the tasks of the present invention. In essence, this includes any machine that is capable of accepting a structured input and of processing the input in accordance with prescribed rules to produce an output. Furthermore, those skilled in the art will understand that the system shown in FIG. 2 may be implemented in hardware, software, or a combination of both, and is not limited to any particular physical, structural, or electrical configuration.

The electrical rules checker 100 program of the present invention is preferably configured to operate on an output of the static timing analyzer 10. In this regard, the static timing analyzer may be configured to generate an output netlist database, which the electrical rules checker 100 of the present invention utilizes as an input. As previously mentioned, there are a wide variety of reasons why an electrical rules checking program may be desired. One such reason is to perform various checks over certain rules or strategies in an integrated circuit design. Such rules may vary from circuit to circuit, depending upon the particular application. For example, a portion 102 of the electrical rules checker program 100 operates to evaluate an output node of a clock driver circuit to determine whether the load on it is within specification.

As is known, a large scale integrated circuit design is often done at the FET level. A designer may utilize thousands of interconnected FETs in designing a portion of an integrated circuit. Although the designer may make every effort to follow certain design guidelines, mistakes may nevertheless be made. Accordingly, the electrical rules checker 100 of the present invention provides an excellent mechanism for double-checking designs and design layouts. Furthermore, the electrical rules checker 100 of the present invention may generate an output binary file 106, which may ultimately be used in subsequent executions of the electrical rules checker 100.

However, prior to the electrical rules checker 100 of the present invention performing any of the rules checking tasks, a database of nodes and elements of the circuit to be evaluated is generated. This database is then utilized by the electrical rules checker 100 of the present invention to perform the rules checking tasks. However, it should be noted that the database and the method in which it is generated is not limited to use with any particular rules checker. They may be used with virtually any type of rules checker which evaluates nodes for design quality. For example, the database of the present invention may also be used with rules checkers which evaluate nodes for optical computing systems, mechanical systems and chemical systems. It will be apparent to those skilled in the art how data structures similar to those generated for elements and nodes in the electrical context may be generated in mechanical, chemical and optical computing contexts and used for rules checking in those contexts.

The manner in which this database is generated will now be discussed below with respect to FIGS. 3A–3C. For purposes of illustration, it will be assumed that the static timing analyzer 10, shown in FIG. 2 and discussed above, is the PathMill static timing analyzer, in order to provide an example of one possible implementation of the present invention. However, those skilled in the art will understand that the electrical rules checker 100 of the present invention and the database of the present invention are not limited to use with any particular program.

The PathMill static timing analyzer provides an application program interface (API) which allows the PathMill static timing analyzer to communicate with the electrical rules checker 100 of the present invention. This API allows code external to the PathMill program to be linked to the PathMill program so that the external code and the PathMill program itself comprise one executable which can be run as a single program. The electrical rules checker 100 of the present invention utilizes this API to obtain information from the PathMill static timing analyzer which can be utilized by the electrical rules checker 100 to generate a database, as well as identify NFETs in pull up paths 102 and identify PFETs in pull down paths 104, in accordance with the present invention.

Prior to the database of the present invention being generated, the PathMill program runs and identifies circuit characteristics of the circuit under consideration such as, for example, FET direction, node types, latches, dynamic gates, clocks, rise and fall times, etc. Before the PathMill program terminates, it calls the electrical rules checker 100 of the present invention. The PathMill program has a feature commonly referred to as "hooks", which allows the PathMill program to call routines at various stages of execution. Once the PathMill program has finished identifying the characteristics mentioned above, the PathMill program calls the electrical rules checker 100 of the present invention. The electrical rules checker 100 of the present invention, through this series of subroutine calls, creates its own database of the circuit under consideration.

Figure 3A:
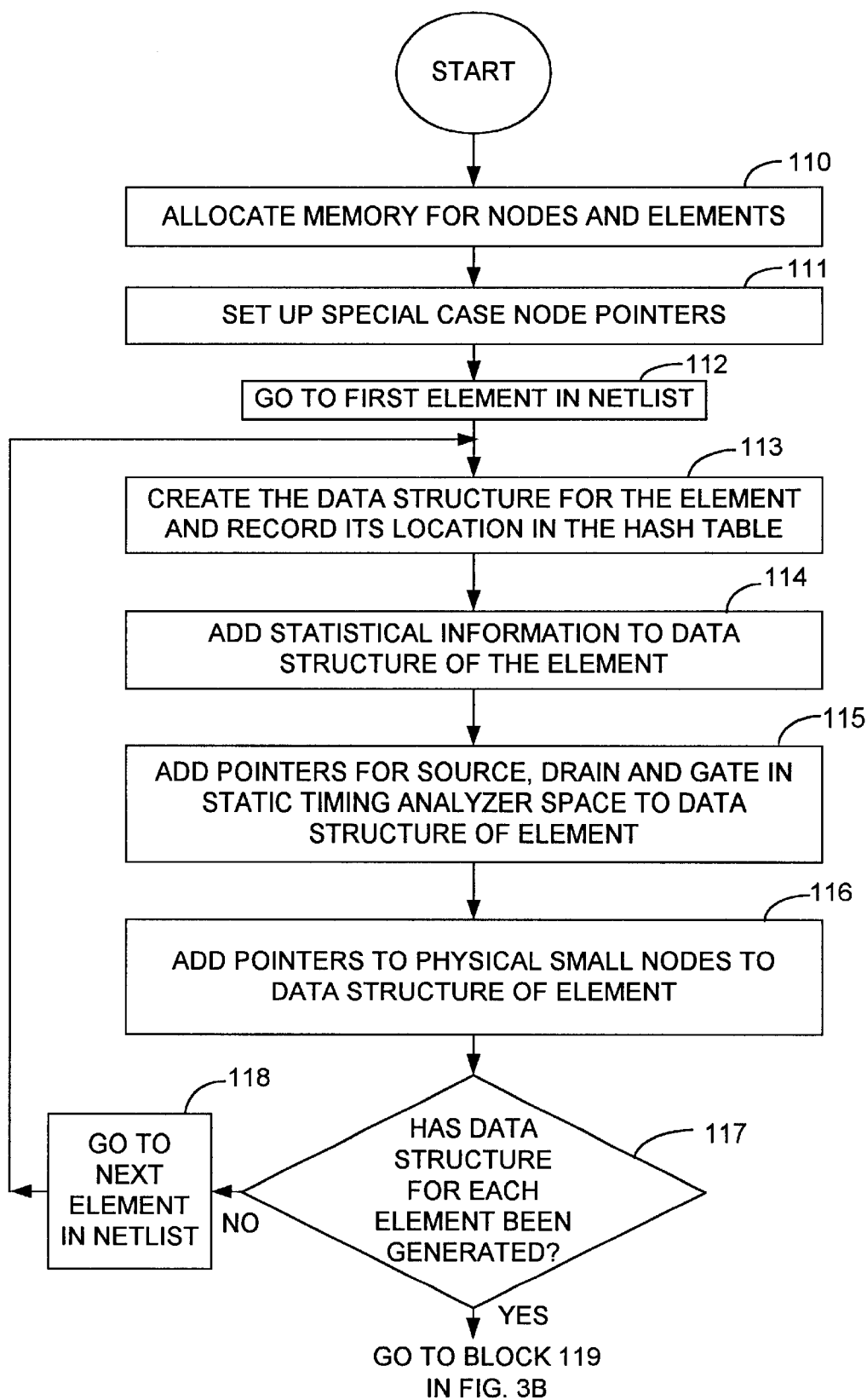
FIGS. 3A–3C collectively depict a flowchart that illustrates a process of generating a database of certain circuit element and node characteristics and properties that my be utilized by the preferred embodiment of the present invention to identify nodes susceptible to floating.
Figure 3B:
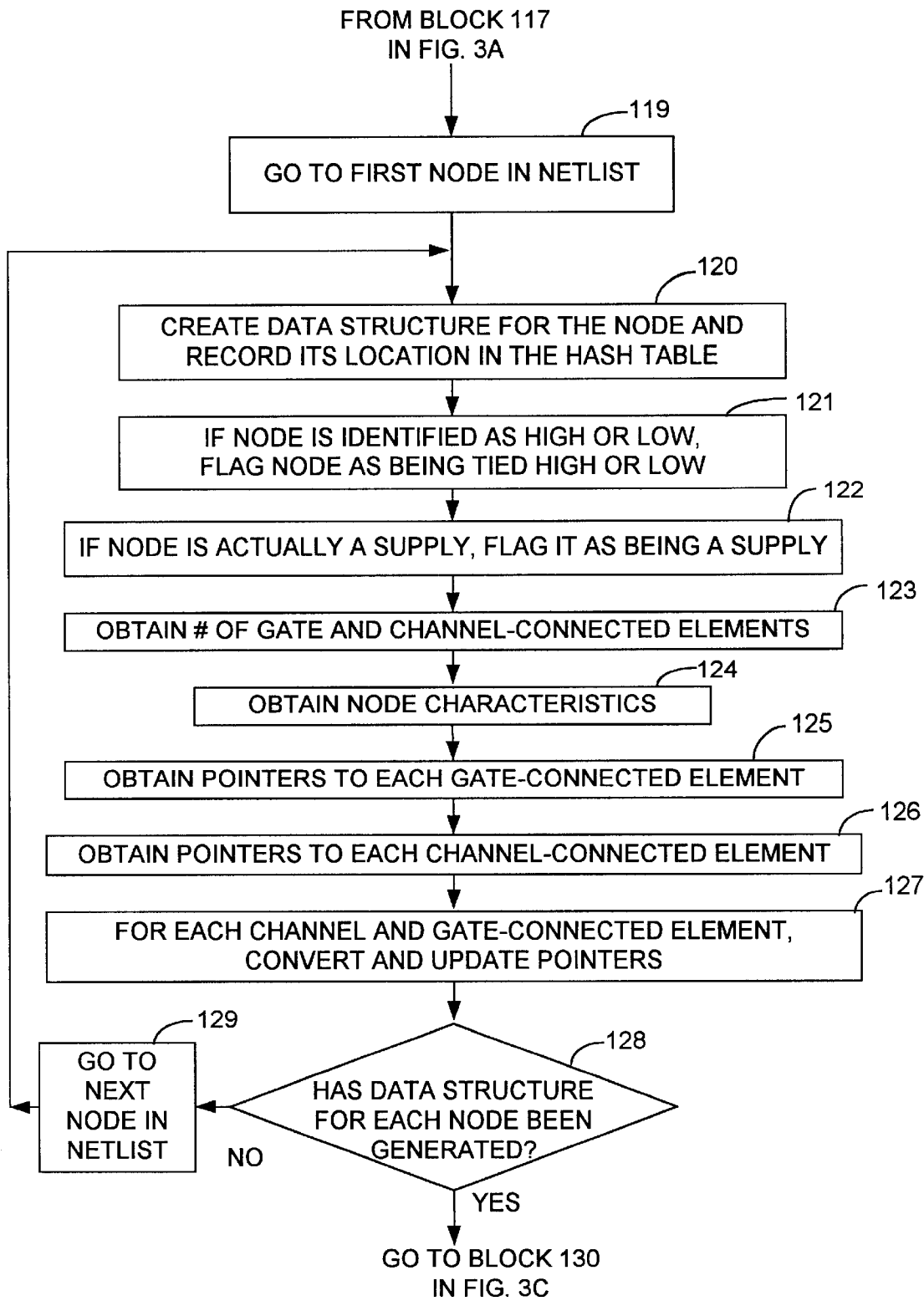

The first step in the process of generating the database is to allocate memory for the nodes and elements of the circuit, as indicated by block 110 in FIG. 3A. The PathMill program provides information via its API about the number of elements and nodes in the circuit of the electrical rules checker 100 and this information is utilized by the electrical rules checker 100 to perform memory allocation. Certain types of nodes and elements do not require as much information about their characteristics as do other types of nodes and elements. Therefore, the amount of memory allocated may vary for different types of nodes and elements. Rather than merely basing memory allocation on the number of nodes and elements in the circuit, it may be desirable to distinguish between different types of nodes and elements so that memory can be more efficiently allocated. However, it will be apparent to those skilled in the art that the present invention is not limited with respect to the manner in which memory space is allocated for the nodes and elements. Those skilled in the art will understand the manner in which the memory allocation task, and any optimizations of it, can be performed. Therefore, in the interest of brevity, a detailed discussion of the memory allocation task for the nodes and elements will not be provided herein.

Once memory has been allocated for the nodes and elements, the next step in the process of the present invention is to set up node pointers for special cases of nodes, as indicated by block 111. These special types of nodes will be used repeatedly during the process of generating the database, as discussed below in more detail. Therefore, the pointers for these nodes preferably are set up relatively early in the database generation process. For example, nodes which correspond to the supplies (GND and VDD) are special types of nodes and it is helpful to set up node pointers for these types of nodes. This is done by finding the nodes whose names match the known names of the supply nodes.

For each element, a data structure must be generated which can be utilized by the electrical rules checker 100 in performing the rules checking tasks. Steps 113–116 in FIG. 3A correspond to the steps for creating the element data structures. The first element for which a data structure must be generated is obtained during the step represented by block 112. The data structure for that element is then generated and the location of the data structure is recorded in a hash table, as indicated by block 113. This step is performed so that the element pointers into the space of the static timing analyzer can be used later to look up the element data structures in the space of the electrical rules checker 100. Hash tables and the manner in which they are utilized are well-known in the art. Therefore, a detailed discussion of the manner in which the pointers into the space of the static timing analyzer are converted using the hash table into pointers into the space of the electrical rules checker 100 will not be provided herein since persons skilled in the art will understand the manner in which this can be accomplished.

Statistical information relating to the element is then added to the data structure of the element, as indicated by block 114. This information includes, for example, the width of the element, the length of the element, the direction of the element, and the element type. Once the statistical information has been included in the data structure of the element, the pointers for the source, drain and gate of the element, as defined in the space of the static timing analyzer, are included in the data structure of the element, as indicated by block 115. The pointers that were set up in step 111 are utilized in step 115. If either the source, drain or gate of the element is attached to ground or VDD, then the pointers for the source, drain and gate are set to the pointers for ground or VDD obtained in step 111.

A circuit and the nodes of the circuit can be represented logically or physically, or as a combination of both. A logical representation of a circuit primarily comprises FETs and does not include any resistors for representing parasitic resistance of the interconnect material. The logical representation of a node is identified in the PathMill program as a "supernode". On the other hand, a physical representation of a node, which is identified in the PathMill program as a "small node", includes FETs, but also includes resistors, which correspond to the parasitic resistance in the node. Therefore, in the physical representation, a small node exists between the resistors representing the parasitic resistance and between any FET and any one of the resistors. In the physical representation, FETs may be connected to different small nodes whereas in the logical representation, those same FETs may be connected to the same supernode.

Each element has a pointer to a supernode and to a small node for each drain, source and gate. Therefore, there are six pointers for each FET. Each small node in the physical representation maps to one particular supernode in the logical representation. In block 116, the pointers corresponding to these small nodes are added to the data structure of the element. A determination is then made at block 117 as to whether or not data structures for all of the elements have been generated. If not, the next element in the netlist is obtained, as indicated by block 118, and the process returns to block 113. If so, the process proceeds to block 119 in FIG. 3B.

Once the data structures for the elements have been generated, the data structures for the nodes must be generated. Blocks 120–127 in FIG. 3B correspond to the steps in the process of the present invention for generating the data structures of the nodes. The first node for which the data structure is to be generated is obtained at the step represented by block 119. The data structure for the node is then generated and the location of the data structure is recorded in the hash table, as indicated by block 120.

For the purpose of design quality analysis, it is important to distinguish actual supply nodes, such as VDD and GND, from other circuit nodes which have been declared to be tied high or low for the purpose of timing or other analysis. In block 121, the rules checker 100 determines, through the use of PathMill API calls, which nodes have been declared to be tied high or low, or are actually high or low because they are actual supply nodes. The rules checker 100 flags the actual high nodes as high and the actual low nodes as low in the step represented by block 121. In the step represented by block 122, the nodes which are actually supplies are flagged as supplies in the database.

The electrical rules checker 100 then obtains the number of gate-connected elements and the number of channel-connected elements from the static timing analyzer, as indicated by block 123. The electrical rules checker 100 also obtains the characteristics of the nodes from the static timing analyzer 10, as indicated by block 124. These characteristics include, for example, capacitance, node type, rise and fall time, etc. Once the characteristics of the node have been obtained, the electrical rules checker 100 obtains the pointers provided by the static timing analyzer 10 that point to each gate-connected element, as indicated by block 125. The electrical rules checker 100 then obtains the pointers from the static timing analyzer which point to each channel-connected element, as indicated by block 126.

The element pointers that are stored in the node during the steps represented by blocks 125 and 126 are pointers into the space of the static timing analyzer. Similarly, the node pointers that are stored in the element during the step represented by block 115 are pointers into the space of the static timing analyzer, except that the pointers to the VDD and GND nodes are stored as pointers to the VDD and GND nodes in the space of the electrical rules checker 100. In the step represented by block 127, some of these pointers are converted to point to the elements and nodes in the space of the electrical rules checker 100. For each of the gate-connected and channel-connected elements of the current node, the following steps are performed, which are represented by block 127:

(1) the element pointer is converted to the corresponding element pointer into the space of the electrical rules checker 100 by looking it up in the hash table. This element pointer replaces the original element pointer in the node structure;

(2) the source, gate, and drain pointers in the element data structure are each checked to see if they point to the current node. If so, the node pointer (into the space of the static timing analyzer) is replaced with the pointer to the current node in the space of the electrical rules checker.

A determination is then made at block 128 as to whether or not data structures for all of the nodes have been generated. If not, the next node in the netlist is obtained, as indicated by block 129, and the process returns to block 120.

Figure 3C:
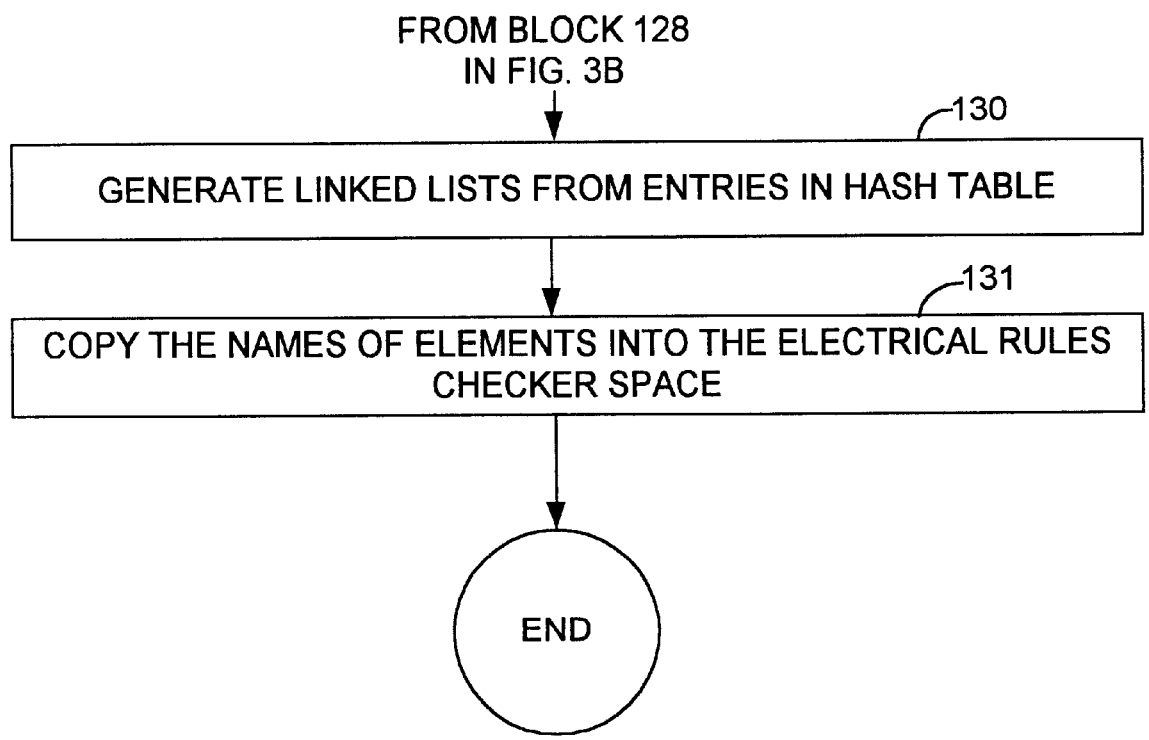

In order to enable the electrical rules checker 100 to maximize efficiency in searching the database of the present invention, once the data structures for all of the nodes have been created, linked lists of elements and nodes are generated from the entries in the hash table, as indicated by block 130 in FIG. 3C. These lists are used by the electrical rules checker 100 of the present invention in searching for an element in the database of the present invention. When searching for an element, the electrical rules checker 100 simply analyzes the elements contained in the linked list.

It should be noted that the arrangement of the elements and nodes in the linked lists may or may not have any physical relationship to the arrangement of the elements and nodes in the circuit under consideration. Thus, the linked lists are merely used to search through the elements and nodes stored in the database.

Once the linked lists have been generated, the names of the elements and nodes contained in the linked list are copied into electrical rules checker space, as indicated by block 131. This reduces the number of calls that need to be made to the PathMill program by the electrical rules checker 100. Once the database of the present invention has been generated, no more calls have to be made to the PathMill program via the PathMill API. The database of the present invention is comprised as the binary file 106 shown in FIG. 2.

Once the database of the present invention has been generated in the manner described above, the electrical rules checker 100 of the present invention utilizes this database to perform the rules checking tasks. As previously mentioned, one such task, and the one performed by the present invention is the identification of clock driver output nodes having a load (from surrounding circuitry) that is out of specification for that driver circuit.

Having described the environment of the present invention, as well as the steps of generating a database of information pertaining to the various elements and nodes within a netlist file, reference will now be made in more detail to the preferred embodiment of the present invention. In this regard, reference is made briefly to FIG. 4, which illustrates a portion of a data structure that may be created and utilized in reference to a given node of the netlist file. As previously mentioned, for a given node within the netlist file, a plurality of flags may be set for various characteristics and attributes associated with a given node. Two such characteristics or attributes that may be utilized by a system and method of the present invention include "Capacitance" (i.e., the load on the node) and "Clock" (i.e., whether or not the given node is associated with a clock driver). Both of these pieces of information may be obtained from PathMill, or some other software package of similar nature. Alternatively, these values may be directly computed by the system and method of the present invention. This computation, however, may be conducted in a manner which is known by those skilled in the art, and therefore need not be described herein. What is significant for purposes of the present invention is that a capacitance value may be stored (or calculated) which defines the load on a given node within a circuit defined by a netlist file. Similarly, a flag may be set (or determined) to identify whether a given node is associated with a clock driver. Thus, it will be appreciated that the "clock" flag will be set even for internal nodes of a clock driver circuit. Accordingly, and as summarized above, the present invention will first determine whether a given clock node is a clock driver output node. In this regard, a clock driver output node will generally be identified as an output node in a circuitous inverter loop.

Figures 4, 5:
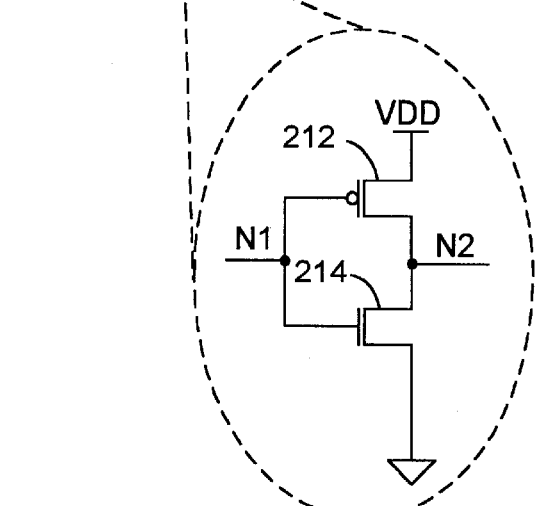
FIG. 4 is a diagram illustrating a portion of a data structure for a circuit node within a netlist file.
FIG. 5 is a schematic diagram illustrating an inverter loop.

To illustrate an inverter loop, reference is briefly made to FIG. 5, which shows inverters 202 and 204 configured in an inverting loop, with interim nodes N1 and N2. As is known by those skilled in the art, an inverter may be constructed from a pair of series connected FETs 212 and 214. Specifically, the channel nodes of the two FETs 212 and 214 are series connected between VDD and ground. A first node N1 (or signal) drives the gate nodes of both FET devices 212 and 214. The output node N2 is then taken from the node interconnecting the two FETs 212 and 214. Specifically, the FETs 212 and 214 include a PFET 212 and an NFET 214. When the value on node N1 is zero, PFET 212 is turned on, while NFET 214 is turned off, thereby providing an output on node N2 of VDD (or logic 1). Conversely, when a logic high signal is provided on node N1, then NFET 214 is turned on, while PFET 212 is turned off. As a result, NFET 214 pulls node N2 down to ground, thereby providing a logic zero on the output of node N2.

Figure 6:
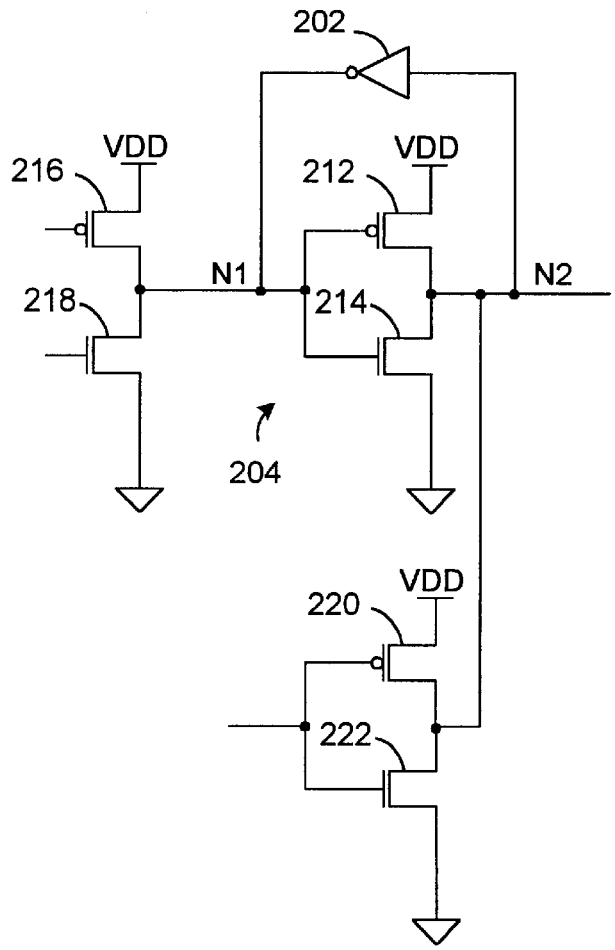
FIG. 6 is a schematic diagram illustrating a portion of a clock driver circuit.

To better illustrate the concepts and teachings of the present invention, reference is now made to FIG. 6, which is a schematic diagram illustrating a clock driver output node N2. Like the circuit illustrated in FIG. 5, node N2 is an interim node of an inverter loop including inverter 202 and inverter 204 comprised of FETs 212 and 214. In addition, a separate inverter element, comprised of FETs 220 and 222, is configured to drive node N2 as well. A further FET configuration, comprising FETs 216 and 218, is configured to drive node N1. In accordance with the present invention, node N2 is identified as a clock driver output node. In a manner as previously described, this determination may be made by evaluating a clock flag within a pre-computed data structure, coupled with the recognition of node N2 as being an interim node in an inverter loop. Then, the present invention computes a PFET: NFET ratio of the clock driver output N2. This ratio is computed by summing the value of the PFETs 212 and 220 that drive node N2, and dividing that sum by the summation of NFETs 214 and 222 that drive node N2. By way of example, if PFET 212 has a width of 90 microns, and PFET 220 has a width of 60 microns, then the sum of the PFETs driving the node will be a total of 150 microns. Similarly, if NFET 214 has a width of 45 microns and NFET 222 has a width of 30 microns, then the sum of the NFETs driving node N2 will be 75 microns. Accordingly, the ratio of PFETs to NFETs driving node N2 will be 150: 75, or 2:1.

After making this determination, the present invention then determines a category for the clock driver output node. This category may be determined by using the ratio calculated above to access a look up table. In accordance with one embodiment of the present invention, a look up table may be like that set forth below.

TABLE 1

| Category | PFET:NFET |
| --- | --- |
| 1 | 3.33–3.67:1 |
| 2 | 1.67–2:1 |
| 3 | 2.67–3:1 |

Continuing with the example begun above, if the ratio of the clock driver node N2 is 2:1, then the clock driver output node will be identified as a category 2 driver node. It should be appreciated that, as used herein, the term "category" has no significant meaning in the art, but rather is simply a term used to facilitate the description of the present invention. Likewise, the number or identity associated with any given category has no special significance or meaning, other than to provide a mechanism for accessing a look up table or other means for storing various load ratings and/or load parameters.

Once the present invention has categorized the clock driver output node N2, it may then obtain a load associated with the node N2. As previously mentioned, this load may be defined in the form of a capacitance value, which may be provided by PathMill or other similar software product known in the art. Alternatively, this value may be computed by the system of the present invention independently, but in a manner that will be known and/or appreciated by persons skilled in the art. The present invention then determines whether the capacitance or load at the output node N2 is within the drive capability of the clock driver of the present invention. In the preferred embodiment, this determination is made by utilizing the category of the clock driver node to access a look up table, or external file containing drive parameters. By way of numerical example, assume that a category 2 clock driver is capable of nominally driving 10 femto-Ferads (e.g., a range of 8–12 femto-Ferads) per micron of NFET width. In the example provided above, the total NFET width was 75 microns. Accordingly, in the example provided herein, the clock driver circuit would be capable of driving a nominal load of 750 femto-Ferads (e.g., range of 600 to 900 femto-Farads). Accordingly, this value may be compared against the load determined or retrieved for the given node N2. So long as the capacitance value of the node N2 does not exceed the drive capability (or fall below the drive specification) as determined by the system of the present invention, then no error will be generated. If, however, the capacitance of a given node exceeds the drive capability determined by the present invention, then the preferred embodiment may generate an error or warning message to the circuit designer to this effect. This will enable the circuit designer to reconfigure the clock driver circuit by changing the dimensions of the FET devices driving the circuit, adding additional FETs, or making another appropriate design change to accommodate the load on the output node N2.

As described above, one step of the present invention is to calculate a PFET: NFET ratio for the clock driver output node N2. In the example provided in connection with FIG. 6, two pairs of FET drivers were disposed to drive the output node N2. It will be appreciated, however, that in many instances additional FETs may be cascaded to drive a given node. For example, an inverter element may comprise two or more PFETs 230 and 232 coupled with two or more NFETs 234 and 236. An equivalent circuit may be readily be obtained by combined the values of the FET widths. Thus, if FET 230 has a width of 40 and FET 232 has a width of 50, an equivalent circuit would comprise a PFET 240 having a width of 90 microns.

Similarly, if NFET 234 has a width of 25 microns and NFET 236 has a width of 20 microns, then an equivalent circuit would comprise an NFET 242 having a width of 45 microns. Equivalency calculations of this type will be appreciated by persons skilled in the art, and may be carried out coincident with the step of calculating the PFET: NFET ratio.

Figure 8:
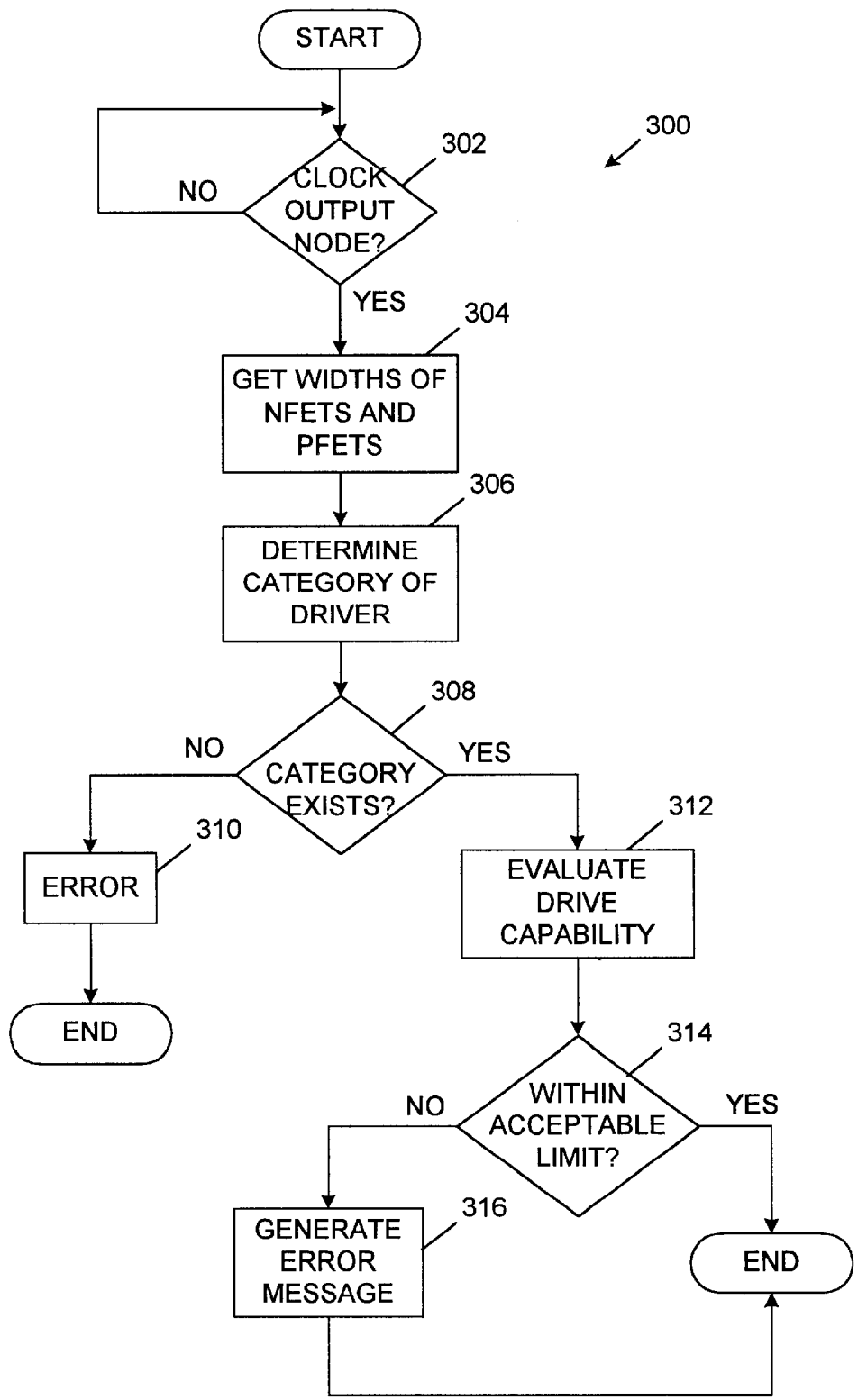
FIG. 8 is a flowchart illustrating a top-level functional operation of a system constructed in accordance with one aspect of the invention.

Having illustrated circuitry that depicts the present invention, reference is now made to FIG. 8, which is a flow chart 300 illustrating the top-level functional operation of a system constructed in accordance with the present invention. In this regard, a first step may be to evaluate each independent node of a netlist file to determine or identify clock output nodes (step 302). For each such identified node, the method of the present invention obtains the widths of the various NFETs and PFETs that drive the node (step 304). The specific operation of this step will be more particularly described in connection with FIG. 9. It will be appreciated that this information is provided as a part of the netlist file and may be readily retrieved therefrom. Thereafter, the method determines the category of the clock driver. Once the category of the clock driver has been determined, then the method of the present invention evaluates the drive capability of the node, in comparison to the load on that same node (step 312).

In a preferred embodiment, and simply as a result of the manner in which the preferred embodiment is implemented, a separate check may be made (step 308) to determine whether the identified category of driver circuit actually exists. During normal operation, this evaluation will typically resolve to YES. If, however, it resolves to NO, then an appropriate error message may be generated (step 310). With regard to step 312, the present invention may access a look up table or a separate parameters file to determine the drive capability of a node of a given category of driver circuit. This drive capability may be expressed in terms of capacitance drive capability per micron of NFET width. Therefore, the total NFET width that drives the output node may be multiplied by this value and then compared against the capacitance value (or load) of the given clock driver output node to determine whether the drive capability is larger than the capacitance value of the node (step 314). If not, then the system may generate an error message (step 316) alerting the circuit designer that the given node exceeds the specification, with regard to drive capability.

Figure 9:
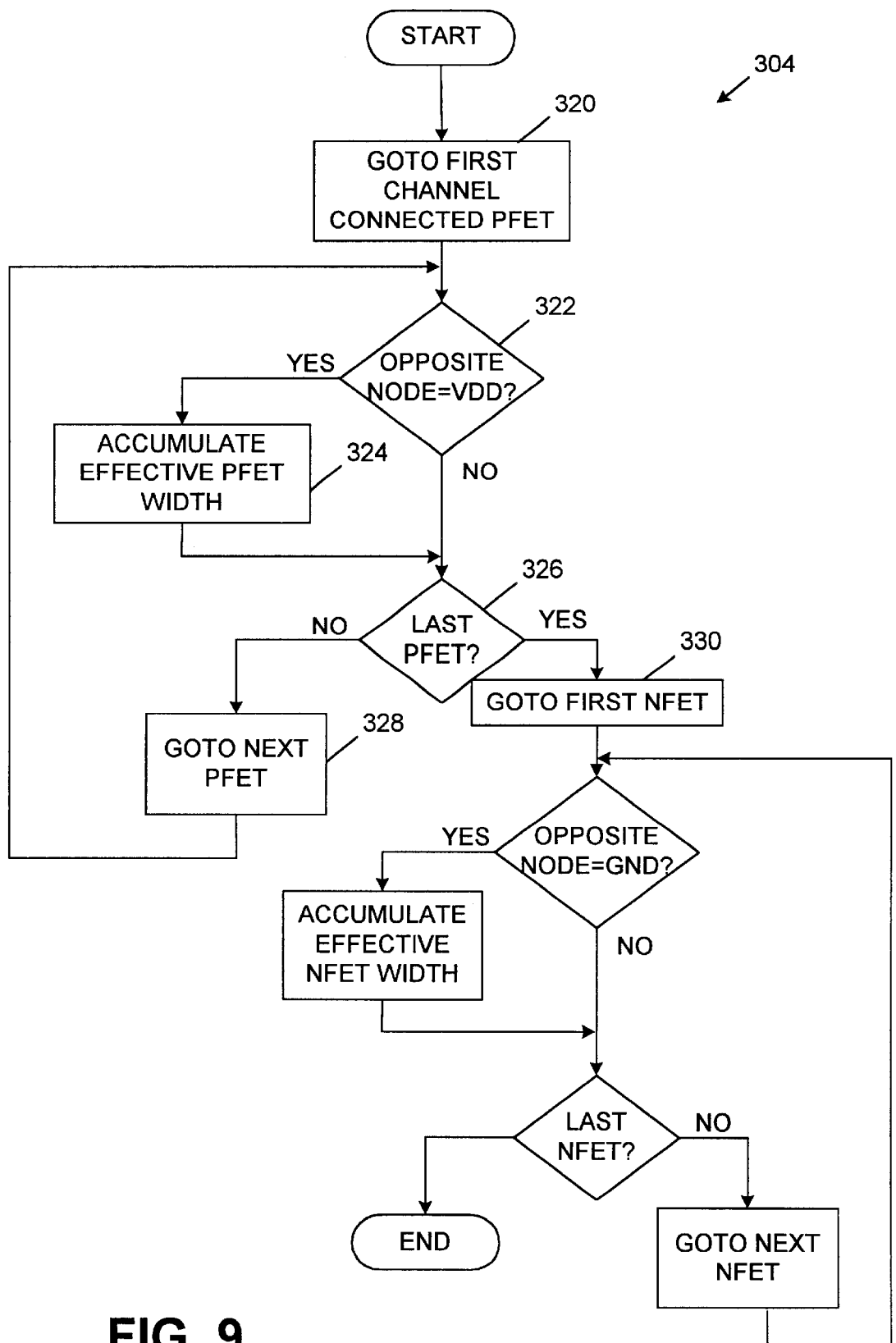
FIG. 9 is a flowchart illustrating the top-level functional operation of step 304 as shown in FIG. 8.

Reference is now made to FIG. 9, which is a flow chart illustrating the top-level operation of step 304 (of FIG. 8), which obtains the widths of the various NFET and PFET devices that drive a node. In this regard, and for a given node, the system of the present invention will evaluate each PFET and each NFET that are channel connected to the node. Thus, the system may begin by proceeding to a first channel connected PFET (step 320), and evaluate whether the opposite node is connected to VDD (step 322). If not, the method may ignore this PFET for purposes of the drive calculation. If so, however, then the present invention may accumulate the effective PFET width (step 324) by adding this value to a cumulative value of other PFETs channel connected to this node. The system may then determine (step 326 whether that PFET is the last PFET that is channel connected to the node. If not, it proceeds to the next PFET (step 328), it continues the width accumulation, as described above. If, however, the PFET is the last PFET channel connected to the node, then he method may proceed to step 330 and perform the same calculations with respect to each NFET that is channel connected to the node.

Figure 7:
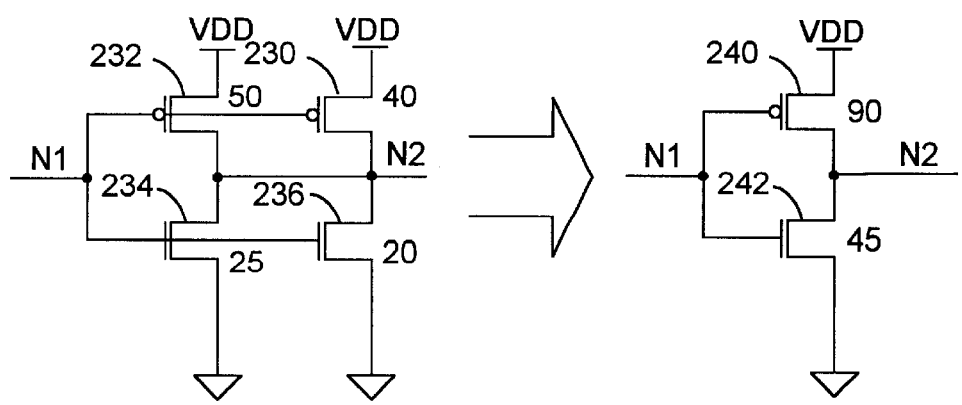
FIG. 7 is a schematic diagram illustrating equivalent PFET and NFET configurations.

By way of clarification to the flow chart of FIG. 9, the evaluations made to the various PFETs and NFETs, in the preferred embodiment, are made to "effective" PFET and NFET values. That is, where a plurality of PFETs are connected in parallel between the node and VDD (see PFETs 230 and 232 of FIG. 7), then a single effective PFET will be generated for purposes of the evaluation. Therefore, if step 322 resolves to NO, it indicates that the given PFET that is presently evaluated is not part of a clock driver output. A similar equivalency evaluation is made for the NFETs that are channel connected to the clock driver output node.

Figure 10:
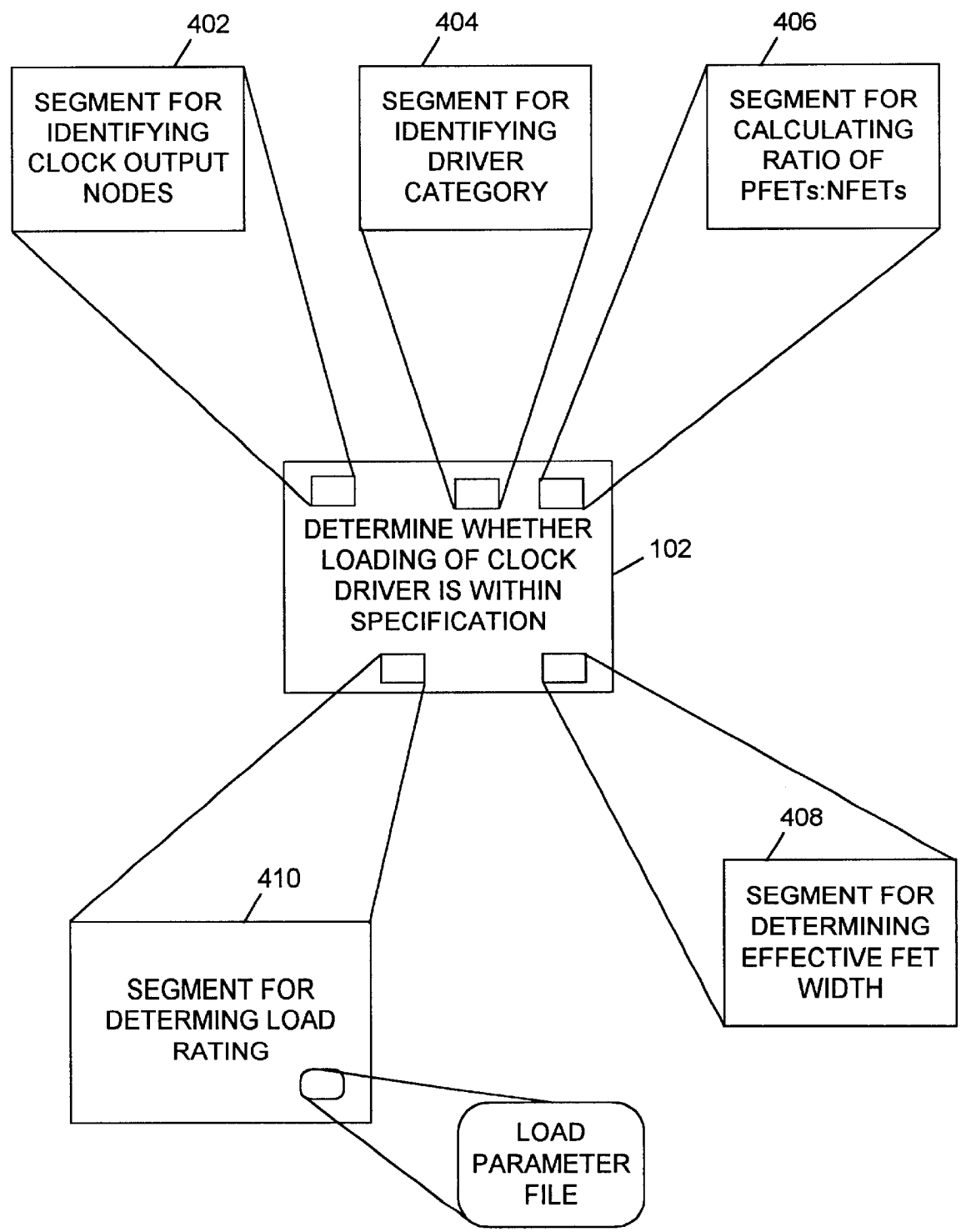
FIG. 10 is a block diagram illustrating certain fundamental code segments comprising a system constructed in accordance with the invention.

It will be appreciated that the steps illustrated in the flow charts of FIGS. 3A–3C, 8, and 9 are provided for purposes of illustration and are not deemed to be limiting on the broader aspects of the present invention. Indeed, the broader aspects of the invention may be implemented using a variety of different approaches that are still consistent with the scope and content of the present invention. As illustrated in FIG. 2, a portion 102 of the electrical rules checker program 100 of the present invention is configured to evaluate a node of a clock driver circuit to determine whether it is within specification. In the preferred embodiment, the system comprises software which may be provided on a computer readable storage medium in the form of code segments that are particularly configured to perform various functions. In this regard, reference is now made to FIG. 10 which illustrates certain functions which may be carried out by a system constructed in accordance with the teachings of the invention. For example, a first code segment 402 may be provided for identifying a output node of a clock driver. Another segment 404 may be provided for identifying a "category" for the clock driver circuit. Another segment (406) may be provided for calculating a PFET:NFET ratio. Still another segment may be provided for determining or computing the effective width of PFETs and NFETs that are driving the clock driver output node. Yet another segment may be provided for determining the load rating of a given category of driver. This segment may access a lookup table or external file that stores such information. Consistent with the broader concepts of the invention, additional, fewer, or different segments may also be provided.

It should be appreciated that the flow charts of FIGS. 3A–3C, 8, and 9 show the top-level operation of only one possible implementation of the methods of the present invention. In this regard, each block represents a module, segment, or portion of code, which comprises one or more executable instructions for implementing the specified logical function(s). It should also be noted that in some alternative implementations, the functions noted in the blocks may occur out of the order noted in FIGS. 3A–3C, 8, and 9. For example, two blocks shown in succession may in fact be executed substantially concurrently or the blocks may sometimes be executed in the reverse order, depending upon the functionality involved.

The foregoing description is not intended to be exhaustive or to limit the invention to the precise forms disclosed. Obvious modifications or variations are possible in light of the above teachings. In this regard, the embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A method for evaluating a node of a driver circuit comprising the steps of:

identifying a clock driver output node;

calculating a PFET:NFET ratio of the clock driver output node;

determining a category of the clock driver output node, based upon the PFET:NFET ratio;

obtaining a load of the clock driver output node, based upon the determined category; and determining whether the load is within specification for the driver circuit.

2. The method as defined in claim 1, further including the step of obtaining a load rating for the category of the clock driver.

3. The method as defined in claim 2, wherein the step of determining whether the load is within specification further includes the step of comparing the load rating with the load of the clock driver output node and the driver circuit.

4. The method as defined in claim 2, wherein the step of obtaining the load rating includes retrieving the load rating from a parameter file.

5. The method as defined in claim 1, wherein the step of calculating the PFET:NFET ratio of the clock driver output node includes summing a width of each PFET configured to drive the output node.

6. The method as defined in claim 1, wherein the step of calculating the PFET:NFET ratio of the clock driver output node includes summing a width of each NFET configured to drive the output node.

7. The method as defined in claim 1, wherein the step of identifying a clock driver output node includes evaluating a flag within a data structure of a node in a netlist.

8. The method as defined in claim 1, wherein the step of identifying a clock driver output node includes identifying a circuitous inverter configuration surrounding the node.

9. A method for evaluating a node of a driver circuit comprising the steps of:

identifying a clock driver output node;

calculating a PFET:NFET ratio of the clock driver output node;

obtaining a load of the clock driver output node, based upon the PFET:NFET ratio; and determining whether the load is within specification for the driver circuit.

10. A computer readable storage medium containing program code for evaluating a node of a driver circuit comprising:

a first segment configured to identify a clock driver output node;

a second segment configured to calculate a PFET:NFET ratio of the clock driver output node;

a third segment configured to determine a category of the clock driver output node, based upon the PFET:NFET ratio;

a fourth segment configured to obtain a load of the clock driver output node, based upon the determined category; and a fifth code segment configured to determine whether the load is within specification for the driver circuit.

11. The computer readable storage medium as defined in claim 10, further including a segment configured to obtain a load rating for the category of the clock driver.

12. The computer readable storage medium as defined in claim 11, wherein the segment configured to determine whether the load is within specification is further configured to compare the load rating with the load of the clock driver output node and the driver circuit.

13. The computer readable storage medium as defined in claim 11, wherein the segment configured to obtain the load rating is configured to retrieve the load rating from a parameter file.

14. The computer readable storage medium as defined in claim 10, further including a segment configured to sum a width of each PFET configured to drive the output node.

15. The computer readable storage medium as defined in claim 10, further including a segment configured to sum a width of each NFET configured to drive the output node.

16. The computer readable storage medium as defined in claim 10, further including a segment configured to evaluate a flag within a data structure of a node in a netlist.

* * * * *